(12) United States Patent
Shao et al.

(10) Patent No.: US 10,706,205 B2
(45) Date of Patent: Jul. 7, 2020

(54) DETECTING HOTSPOTS IN PHYSICAL DESIGN LAYOUT PATTERNS UTILIZING HOTSPOT DETECTION MODEL WITH DATA AUGMENTATION

(71) Applicant: International Business Machines Corporation, Armonk, NY (US)

(72) Inventors: Dongbing Shao, Wappingers Falls, NY (US); Jing Sha, White Plains, NY (US); Kafai Lai, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/166,892

(22) Filed: Oct. 22, 2018

(65) Prior Publication Data

US 2020/0125695 A1     Apr. 23, 2020

(51) Int. Cl.
*G06F 30/30* (2020.01)
*G06K 9/62* (2006.01)
(Continued)

(52) U.S. Cl.
CPC ......... *G06F 30/398* (2020.01); *G06K 9/3216* (2013.01); *G06K 9/6256* (2013.01);
(Continued)

(58) Field of Classification Search
CPC .............. G06F 17/5081; G06K 9/3216; G06K 9/6256; G06K 9/6269; G06N 3/0418
(Continued)

(56) References Cited

U.S. PATENT DOCUMENTS

| 7,707,526 B2 * | 4/2010 | Su et al. ............. G06F 17/5068 716/136 |
| 8,037,428 B2 | 10/2011 | Tong et al. |

(Continued)

FOREIGN PATENT DOCUMENTS

| CN | 107053168 A | 8/2017 |
| WO | 2017194281 A1 | 11/2017 |

OTHER PUBLICATIONS

Zhou et al. "Hotspot Detection of Semiconductor Lithography Circuits Based on Convolutional Neural Network", Dec. 2018, Journal of Microelectronic Manufacturing, 8 pages.*
(Continued)

*Primary Examiner* — Sun J Lin
(74) *Attorney, Agent, or Firm* — Vazken Alexanian; Ryan, Mason & Lewis, LLP

(57) ABSTRACT

A method for detecting hotspots in physical design layout patterns includes receiving a given physical design layout pattern, utilizing a hotspot detection model to detect one or more potential hotspots in the given physical design layout pattern, and performing a verification to determine whether a given potential hotspot of the one or more potential hotspots detected by the hotspot detection model comprises a real hotspot or a nonexistent hotspot. The method also includes, responsive to determining that the given potential hotspot comprises an actual hotspot, modifying the given physical design layout pattern to remove the actual hotspot. The method further includes, responsive to determining that the given potential hotspot comprises a nonexistent hotspot, augmenting the hotspot detection model with additional training data generated based on the nonexistent hotspot.

20 Claims, 9 Drawing Sheets

(51) Int. Cl.
*G06K 9/32* (2006.01)
*G06N 3/04* (2006.01)
*G06F 30/398* (2020.01)
*G06F 17/50* (2006.01)

(52) U.S. Cl.
CPC ......... *G06K 9/6269* (2013.01); *G06N 3/0418* (2013.01); *G06K 2009/3225* (2013.01)

(58) Field of Classification Search
USPC ................................................ 716/110, 111
See application file for complete search history.

(56) References Cited

U.S. PATENT DOCUMENTS

| | | | | |
|---|---|---|---|---|
| 8,073,263 | B2* | 12/2011 | Hull et al. ......... | G06K 9/00463 382/224 |
| 8,402,397 | B2* | 3/2013 | Robles et al. ...... | G06F 17/5081 430/30 |
| 8,504,949 | B2* | 8/2013 | Robles et al. ...... | G06F 17/5081 716/52 |
| 8,509,517 | B2* | 8/2013 | Blanton et al. ......... | G06T 7/001 382/100 |
| 8,601,419 | B1* | 12/2013 | Chiang et al. ...... | G06F 17/5081 716/112 |
| 9,098,649 | B2 | 8/2015 | Chiang et al. | |
| 9,626,459 | B2 | 4/2017 | Agarwal et al. | |

OTHER PUBLICATIONS

Yu et al. "Machine Learning and Pattern Matching in Physical Design", Jan. 2015, 20th Asis and South Pacific Design Automation Conference, Technical Digest pp. 286-293.*

Ding et al. "Machine Learning based Lithographic Hotspot Detection with Critical-Feature Extraction and Classification", May 2009, IEEE Internal Conference on IC Design and Technology, Technical Digest, 4 pages.*

Disclosed Anonymously, "A Method for Predicting 3-D Lithographic Hotspots from Layout Data," ip.com, IP.com No. IPCOM000239403D, Nov. 5, 2014, 5 pages.

Y. Lin et al., "Machine Learning for Mask/Wafer Hotspot Detection and Mask Synthesis," Proceedings of SPIE, Oct. 16, 2017, 14 pages, vol. 104510A.

R.R. Selvaraju et al., "Grad-CAM: Why Did You Say That? Visual Explanations from Deep Networks via Gradient-Based Localization," arXiv.1610.02391v1, Oct. 7, 2016, 17 pages.

M. Shin et al., "Accurate Lithography Hotspot Detection Using Deep Convolutional Neural Networks," Journal of Micro/Nanolithography, MEMS, and MOEMS, Nov. 18, 2016, 14 pages, vol. 15, No. 4.

H. Yang et al., "Imbalance Aware Lithography Hotspot Detection: A Deep Learning Approach," Journal of Micro/Nanolithography, MEMS, and MOEMS, Mar. 28, 2017, 14 pages, vol. 16, No. 3.

H. Yang et al., "Layout Hotspot Detection with Feature Tensor Generation and Deep Biased Learning," Proceedings of the 54th Annual Design Automation Conference (DAC), Jun. 18-22, 2017, 6 pages, Article No. 62.

M. Shin et al., "CNN Based Lithography Hotspot Detection," International Journal of Fuzzy Logic and Intelligent Systems (IJFIS), Sep. 2016, pp. 208-215, vol. 16, No. 3.

T. Matsunawa et al., "Automatic Layout Feature Extraction for Lithography Hotspot Detection Based on Deep Neural Network," Proceedings of SPIE, Design-Process-Technology Co-optimization for Manufacturability X, Mar. 16, 2016, 11 pages, vol. 9781.

* cited by examiner

DETECTING HOTSPOTS IN PHYSICAL DESIGN LAYOUT PATTERNS UTILIZING HOTSPOT DETECTION MODEL WITH DATA AUGMENTATION

BACKGROUND

The present application relates to semiconductor manufacturing, and more specifically, to techniques for patterning in semiconductor manufacturing. Patterned structures may include single layer and multi-layer structures. Each layer of a patterned structure may include a number of vias, lines and various other features. Generating and expanding layout pattern libraries for these and other features is useful for evaluating manufacturability.

SUMMARY

Embodiments of the invention provide techniques for detecting hotspots in physical design layout patterns.

In one embodiment, a method for detecting hotspots in physical design layout patterns comprises steps of receiving a given physical design layout pattern, utilizing a hotspot detection model to detect one or more potential hotspots in the given physical design layout pattern, performing verification to determine whether a given one of the potential hotspots detected by the hotspot detection model comprises a real hotspot or a nonexistent hotspot, responsive to determining that the given potential hotspot comprises an actual hotspot, modifying the given physical design layout pattern to remove the actual hotspot, and, responsive to determining that the given potential hotspot comprises a nonexistent hotspot, augmenting the hotspot detection model with additional training data generated based on the nonexistent hotspot. The method is performed by at least one processing device comprising a processor coupled to a memory.

In another embodiment, a computer program product comprises a computer readable storage medium having program instructions embodied therewith. The program instructions are executable by at least one computing device to cause the at least one computing device to perform steps of receiving a given physical design layout pattern, utilizing a hotspot detection model to detect one or more potential hotspots in the given physical design layout pattern, performing verification to determine whether a given one of the potential hotspots detected by the hotspot detection model comprises a real hotspot or a nonexistent hotspot, responsive to determining that the given potential hotspot comprises an actual hotspot, modifying the given physical design layout pattern to remove the actual hotspot, and, responsive to determining that the given potential hotspot comprises a nonexistent hotspot, augmenting the hotspot detection model with additional training data generated based on the nonexistent hotspot.

In another embodiment, an apparatus comprises a memory and at least one processor coupled to the memory and configured for receiving a given physical design layout pattern, utilizing a hotspot detection model to detect one or more potential hotspots in the given physical design layout pattern, performing verification to determine whether a given one of the potential hotspots detected by the hotspot detection model comprises a real hotspot or a nonexistent hotspot, responsive to determining that the given potential hotspot comprises an actual hotspot, modifying the given physical design layout pattern to remove the actual hotspot, and, responsive to determining that the given potential hotspot comprises a nonexistent hotspot, augmenting the hotspot detection model with additional training data generated based on the nonexistent hotspot.

These and other objects, features and advantages of the present invention will become apparent from the following detailed description of illustrative embodiments thereof, which is to be read in connection with the accompanying drawings.

DETAILED DESCRIPTION

Figure 1:
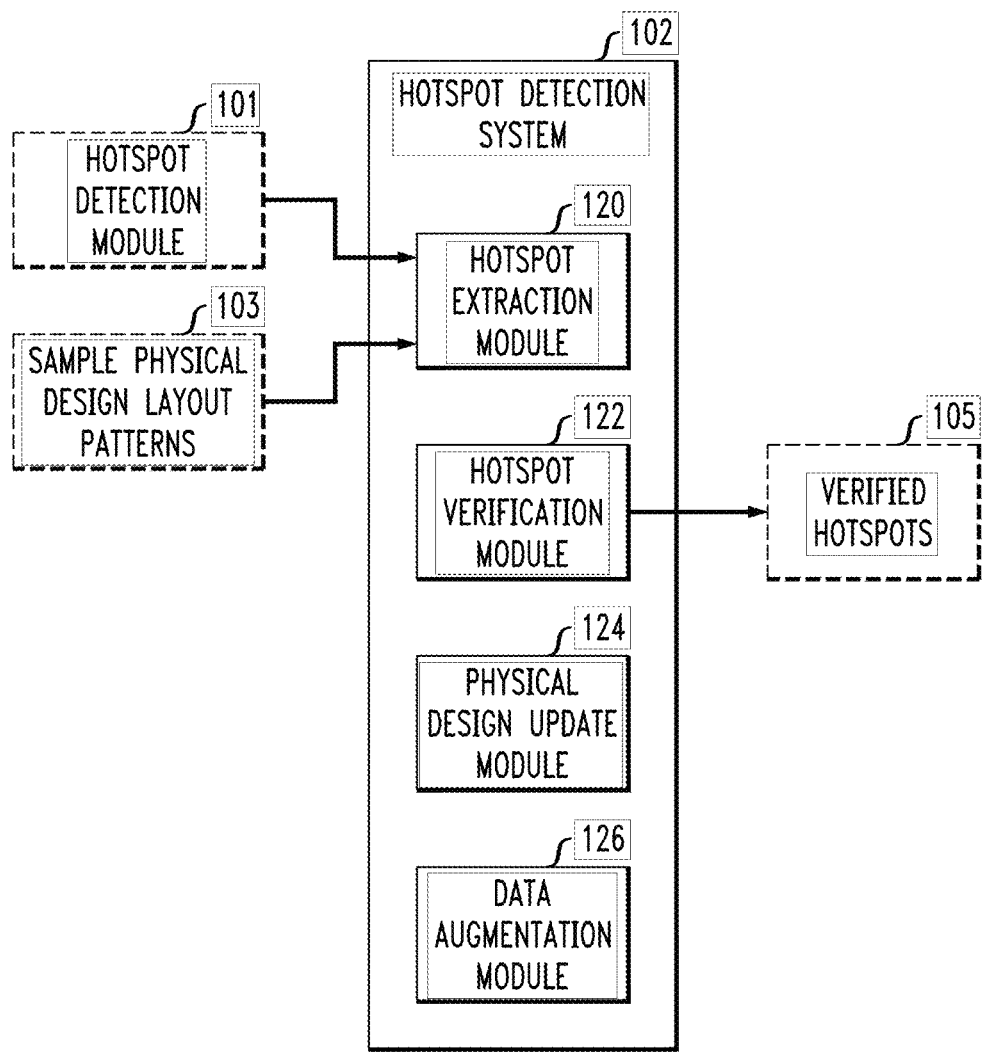
FIG. 1 depicts a system for detecting hotspots in physical design layout patterns, according to an exemplary embodiment of the present invention.

Illustrative embodiments of the invention may be described herein in the context of illustrative methods, systems and devices for detecting hotspots in physical design layout patterns. However, it is to be understood that embodiments of the invention are not limited to the illustrative methods, systems and devices but instead are more broadly applicable to other suitable methods, systems and devices.

As discussed above, determining possible layouts for vias, lines and other features of patterned structures is useful for evaluating manufacturability. Patterned structures include structures formed in semiconductor manufacturing, which may include various materials including but not limited to semiconductors, metals, oxides, etc. in one or more layers. Generating synthetic layout patterns, as an example, can be a crucial part of early stage hot spot and failure mode analysis, especially when real layout data is limited. Synthetic layout patterns are also useful for design space exploration. For example, in conducting a manufacturability study, it is generally desired to have as many design layouts as possible. Layout patterns for patterned structures are critical for assessing the manufacturability of a patterned structure.

Various embodiments will be described in detail herein with respect to detecting and localizing hotspots in physical design layout patterns. In some embodiments, it is assumed that the physical design layout patterns are single-layer physical design layout patterns. It should be appreciated however, that embodiments are not limited to use in detecting hotspots in single-layer physical design layout patterns. In some embodiments, systems may be used to detect hotspots in multi-layer physical design layout patterns.

As component sizes progressively decrease and as the complexity of integrated circuit designs increases, it is becoming more difficult to guarantee that particular circuit designs or layout patterns meet manufacturability requirements. A particular circuit design, for example, may not be manufacturable or may be inoperable in a first iteration, necessitating extensive testing and iterative design revisions. In particular, semiconductor manufacturing processes will often run into "hotspots," which may represent layout patterns or portions thereof that are difficult or impossible to manufacture, or which cause device issues when manufactured. Examples of hotspots include manufacturing errors such as pinching, bridging, missing patterns, etc. that may lead to failure of a fabricated device. A hotspot does not necessarily refer to or identify a specific circuit component, but may instead refer to a region of a physical design layout pattern that is associated with some problem or potential issue in downstream manufacturing or operation.

It should be appreciated that hotspots may take on various forms. A geometry hotspot, for example, may refer to an identified layout feature which has, for example, a width that is less than a minimum defined width threshold, a distance between a pair of layout features that is less than a minimum defined threshold value, etc. An electrical hotspot, as another example, may refer to a device feature that, when printed or fabricated, does not meet one or more prescribed electrical parameters. For example, a transistor having defined geometric specifications (e.g., width, length, etc.), even when printed or fabricated to such geometric specifications, may not meet one or more electrical specifications thus leading to an electrical hotspot. Electrical hotspot detection may be performed on simulated wafer contours, such as with the assistance of contour-to-electrical mapping tools that translate simulated contours into equivalent geometric or rectilinear device parameters (e.g., width, length, etc.).

Existing approaches to hotspot identification, such as process simulation and geometric verification, are each lacking in significant ways. Process simulation may generate simulated layout pattern contours which are then used to check for hotspots. Such simulations are resource-intensive and time-consuming, and do not scale when evaluating larger layouts. Furthermore, the accuracy of the resulting hotspot classification depends on the quality of the simulation, with hotspots potentially being missed if the simulation is lacking.

Geometric verification uses a set of known features associated with hotspots, for example by evaluating geometric similarity of a test layout pattern with registered hotspot patterns. Pattern matching methods in particular are only useful for known hotspot configurations and are inadequate for identifying previously unknown hotspots. Geometric verification further relies on feature engineering.

In addition, both process simulation and geometric verification are generally limited to the detection of intra-layer hotspots that are confined to a single layer of physical design layout. Inter-layer hotspots are even more computationally expensive to detect by process simulation and are nearly impossible to detect by geometric verification.

Deep learning (DL) models, such as convolutional neural network (CNN)-based DL models, may be used in design for manufacturability (DfM) hot spot detection. CNN-based DL models, for example, provide good success rates reported over fixed data sets, and provide a number of advantages. For example, CNN-based and other DL models do not require full chip optical proximity correction (OPC) simulation, saving time and resources (e.g., not requiring electronic design automation (EDA) licenses). Further, CNN-based and other DL models provide for automated hotspot classification after model training (e.g., some CNN-based DL models provide the ability to identify particular types of hotspots, such as bridging, shortening, etc.).

DL models, however, do have some drawbacks. For example, CNN-based and other DL models generally have no physics behind them, and thus need to be updated more often than OPC models. DL models also need a large amount of training data to provide accurate results. Furthermore, DL models do not handle well data that are not seen in training, and thus real design data with significant variety is needed for training. Further, false negative classification (e.g., where the model classifies a given layout pattern as hotspot-free but where the given layout pattern has at least one hotspot) using DL models may be verified, but verifying false positives (e.g., where the model classifies the given layout pattern as hotspot-containing but where the given layout pattern is actually hotspot-free) is a difficult task.

Some embodiments provide a closed-loop EDA flow that improves physical layout designs through detecting DfM hotspots while also improving the performance of a DL model used for detecting such hotspots. Embodiments may incorporate physical design feedback for physical design layout patterns, while also providing feedback for updating the DL model used for detecting hotspots in the physical design layout patterns. The feedback for the DL model provides for accumulative training, such as through training data augmentation as will be described in further detail below.

FIG. 1 shows a system 102 for hotspot detection. The hotspot detection system 102 implements a hotspot extraction module 120, a hotspot verification module 122, a physical design update module 124, and a data augmentation module 126. The hotspot extraction module 120 is configured to utilize a hotspot detection model 101 to detect hotspots in sample physical design layout patterns 103.

As the hotspot detection model 101 may produce erroneous classifications (e.g., false positives, etc.), the hotspot verification module 122 utilizes OPC verification to verify whether a given one of the sample physical design layout patterns 103 being analyzed does or does not contain a hotspot. If the hotspot verification module 122 determines that the given sample physical design layout pattern does in fact have a hotspot, the physical design update module 124 will update the given physical design layout pattern to remove the hotspot. If the hotspot verification module 122 determines that the given sample physical design layout pattern does not contain a hotspot but the hotspot extraction module 120 classifies the given sample physical design layout pattern as hotspot-containing, the data augmentation module 126 will update the hotspot detection model used by the hotspot extraction module 120 to correct the misclassification (e.g., by adding new training data as will be described in further detail below).

The hotspot detection system 102 may output verified hotspots 105 to another entity or system for review and analysis or other remedial action as desired.

Figure 2:
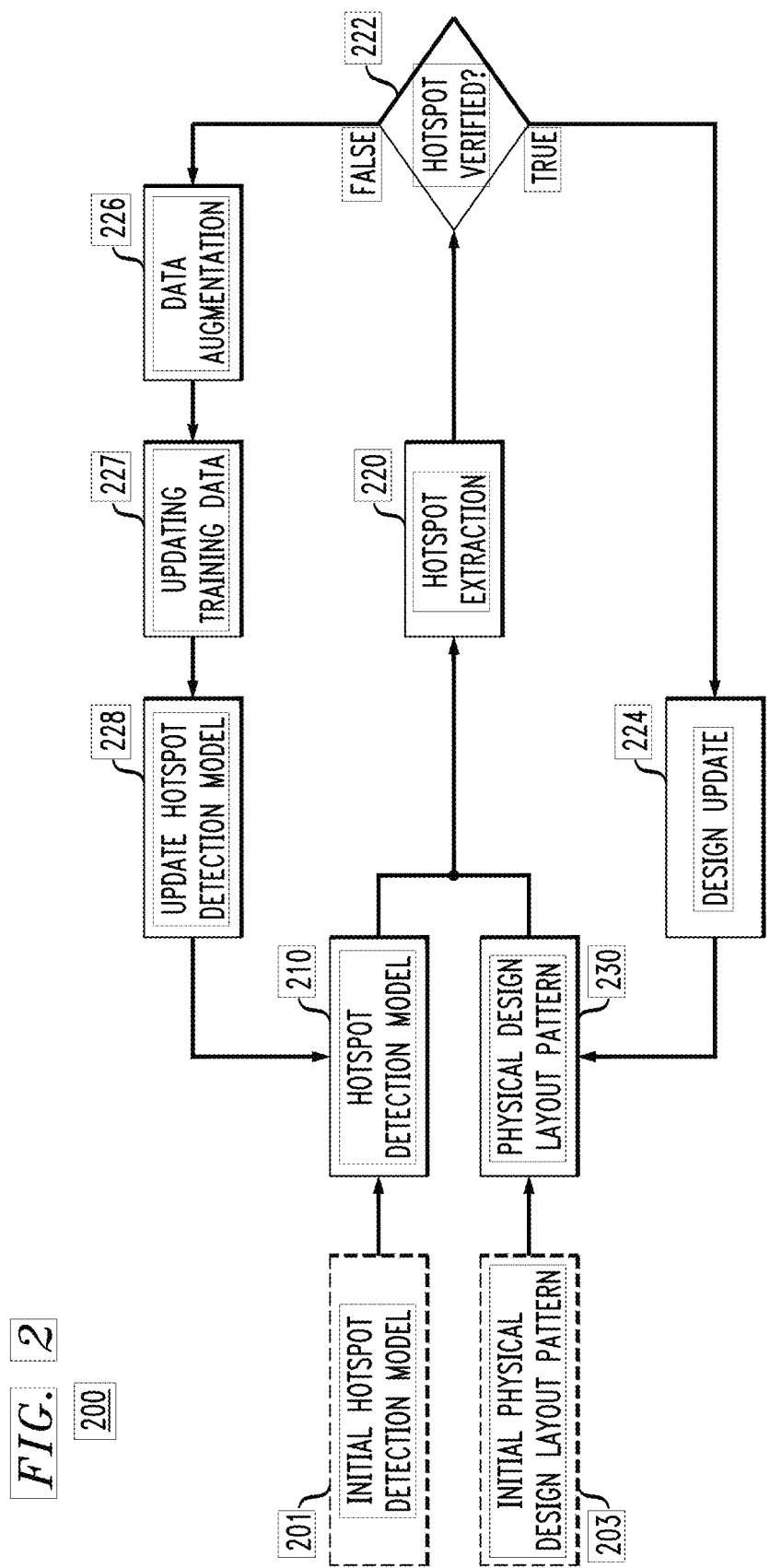
FIG. 2 depicts a workflow for co-optimization of a hotspot detection model and physical design layout patterns, according to an exemplary embodiment of the present invention.

FIG. 2 shows a workflow 200 for co-optimization of a hotspot detection model 210 and a physical design layout pattern 230. The hotspot detection model 210 may be initialized using initial hotspot detection model 201. The initial hotspot detection model 201 may be generated using various test patterns. The test patterns, in some embodiments, are not "real" physical design layout patterns but instead are generated based on a set of design rules and an understanding of design limits. It should be appreciated, however, that the initial hotspot detection model 201 may be at least partially trained using a set of "known" physical design layout patterns (e.g., real physical design layout patterns known to contain or not contain hotspots). The test patterns are used to explore process limits, and may be based on design rules as noted above. Examples of such design rules may include rules relating to tip to tip spacing or distance, tip to side spacing or distance, comb and serpentine structures, etc. The test patterns may also be generated to mimic real physical designs. Generally, the test patterns are simple and do not necessarily represent true design variation. After the initial hotspot detection model is successfully trained over the test patterns, physical design and hotspot detection model ("design-model") co-optimization is performed.

The initial hotspot detection model 201 is input or otherwise provided as the hotspot detection model 210, and an initial physical design layout pattern 203 is provided as the physical design layout pattern 230 to be analyzed. Hotspot extraction 220 uses the hotspot detection model 210, and imports the physical design layout pattern 230 for analysis. Hotspot extraction 220 includes making a determination as to whether the physical design layout pattern 230 contains a hotspot. In some embodiments, this may include classifying the type of hotspot, and may also include localizing the hotspot as will be described in further detail below.

Hotspot verification 222 is then performed using the results from the hotspot extraction 220. Verification includes determining whether the hotspot extraction 220 correctly indicates that the physical design layout pattern 230 contains a hotspot. The hotspot verification 222 may include OPC verification.

If the hotspot verification 222 determines that the hotspot extraction 220 correctly indicates that the physical design layout pattern 230 contains a hotspot (e.g., outputs "true"), the process 200 proceeds to design update 224. During design update 224, the physical design layout pattern 230 is altered so as to remove the detected hotspot. The process 200 then proceeds with another round of hotspot extraction 220 and hotspot verification 222, until no new hotspots are detected and all existing hotspots in the physical design layout pattern are addressed via design updates 224.

If the hotspot verification 222 determines that the hotspot extraction 220 incorrectly indicates that the physical design layout pattern 230 contains a hotspot (e.g., outputs "false" for a false positive), the process proceeds to data augmentation 226. Data augmentation 226 generates new test patterns or training data based on the incorrectly identified hotspot, as will be described in further detail below. The new test patterns or training data is used to update training data 227, and in turn update the hotspot detection model 228 by re-training the hotspot detection model 210 with the updated training data. The process 200 then proceeds with another round of hotspot extraction 220 and hotspot verification 222, until no hotspot false positives are detected.

Data augmentation 226, as noted above, is used for any new hotspots that the hotspot detection model 210 failed to predict correctly (e.g., false positives where the hotspot detection model 210 classified the physical design layout pattern 230 as hotspot-containing but where OPC simulation or other hotspot verification 222 indicates that the physical design layout pattern does not contain the detected hotspot). Data augmentation 226, in some embodiments, may be viewed as teaching the hotspot detection model 210 how to handle "marginal" cases. Thus, an iterative process may be used to modify the physical design layout pattern 230 until it becomes a "true" hotspot as determined by hotspot verification 222. This may include modifying one or more features of the physical design layout pattern 230 in small increments (e.g., 1-2 nanometers (nm) per iterative step) until the "true" hotspot is verified. The modification may be done in multiple dimensions (e.g., X and Y dimensions in a Cartesian coordinate system for a single-layer physical design layout pattern).

The particular modifications that are made to the physical design layout pattern 230 during data augmentation 226 can be automated based on the nature of the hotspot detection model 210 that is used. For example, the hotspot detection model 210 may be a DL model that predicts bridging hotspots, and thus the modification may include reducing the spacing between features (e.g., in 1-2 nm steps) until bridging is detected during hotspot verification 222. As another example, the hotspot detection model 210 may be a DL model that predicts line end shortening hotspots, and thus the modification may include narrowing the line end width until shortening is detected during hotspot verification 222. Various other types of modifications may be performed for other types of hotspots.

In some embodiments, data augmentation 226 includes adding multiple new data points when updating training data 227. For example, N*4 new data points may be added to the existing training data, where N is the number of false positive hotspots detected. The four additional data points for each false positive hotspot may include positive and negative modifications in both X and Y dimensions for a single-layer physical design layout pattern.

Advantageously, the data augmentation 226 and updated training data 227 provides the hotspot detection model 210 with new training data that is based on real design variations not previously seen by the hotspot detection model 210. The number of data points or test patterns used to train the hotspot detection model 210 are thus easily increased in an automated fashion. With both negative and positive data, false positive mistakes in classification utilizing the hotspot detection model 210 may be minimized.

In some embodiments, the hotspot detection model 210 is configured to detect hotspots in physical design layout patterns without full chip simulation. Updates to the physical design layout patterns are performed when true hotspots are detected utilizing the hotspot detection model 210. When false hotspots are detected, the hotspot detection model 210 is accumulatively updated. Further, new training data with true/false flags is generated, where the new training data advantageously is similar to real physical design layout patterns.

Figure 3:
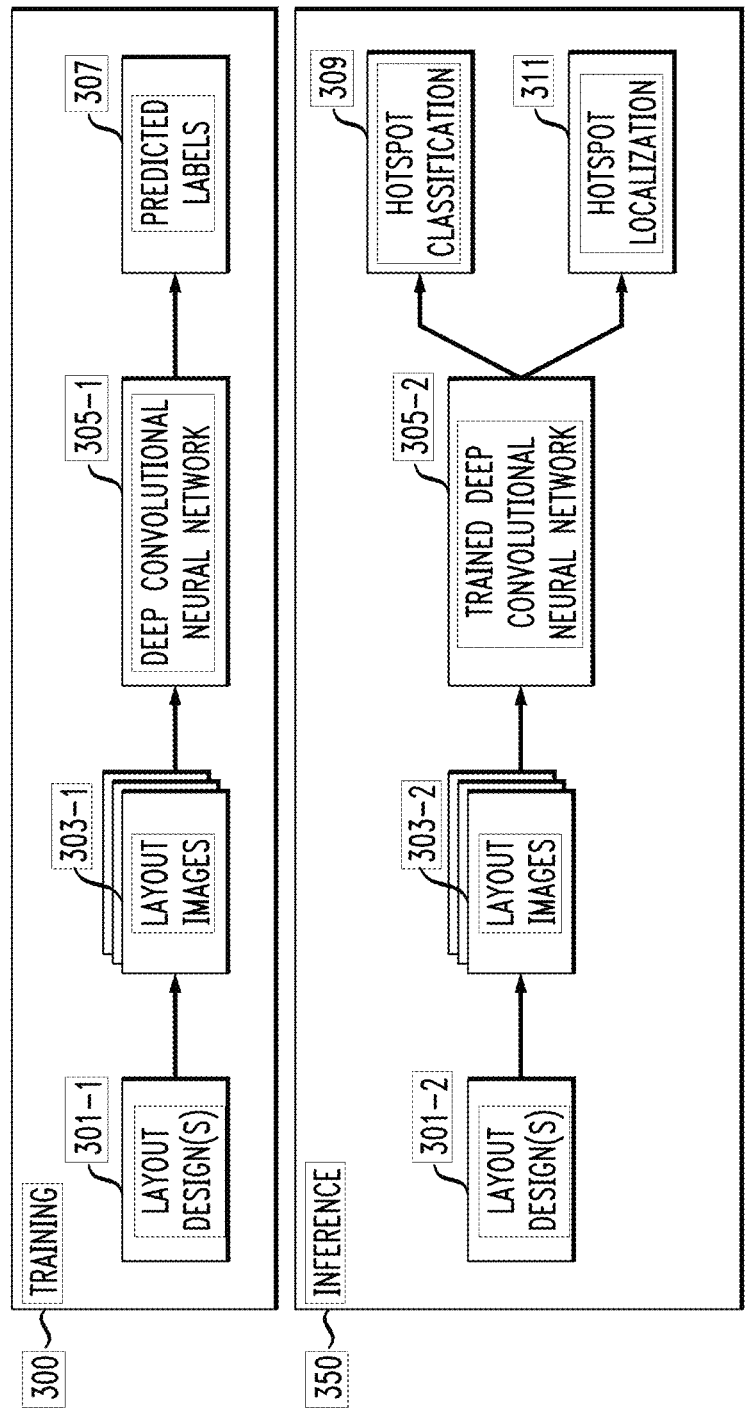
FIG. 3 depicts training and inference workflows for a hotspot detection model implemented as a deep convolutional neural network, according to an exemplary embodiment of the present invention.

Various different types of DL models may be used to implement the hotspot detection model 210. In some embodiments, it is assumed that the hotspot detection model is implemented as a deep CNN model. FIG. 3 shows training and inference workflows 300 and 350, respectively, for a hotspot detection model implemented as a deep CNN 305. During training 300, physical design layout patterns 301-1 are provided as input, and are converted to layout images 303-1 or another format suitable for input and processing by the deep CNN 305-1.

In some embodiments, the input physical design layout patterns 303-1 are converted into layout images in the form of two-dimensional (2D) or three-dimensional (3D) arrays. Single-layer physical design layout patterns may be converted into 2D arrays, where each 2D array may have a size of W×H, where W represents a width of the field of view (FOV), and H represents a height of the FOV. Entries of the 2D arrays may comprise values indicating presence of a given feature at respective positions in the FOV for the given single-layer physical design layout pattern.

Multi-layer physical design layout patterns may be converted into 3D arrays, where each 3D array comprises a set of 2D arrays with each 2D array representing features of one of the layers in a given physical design layout pattern. Each of the 3D arrays may have a size of W×H×N, where W represents a width of the FOV, H represents a height of the FOV, and N represents the number of layers the physical design layout pattern of integrated multi-layers. Entries of the 3D arrays may comprise values indicating presence of a given feature at respective positions in the FOV for a corresponding layer of the given physical design layout pattern of integrated multi-layers.

In other embodiments, input physical design layout patterns 303-1 may be converted into coordinate arrays where each coordinate array comprises feature center coordinates for features in a corresponding physical design layout pattern. The center coordinates may be provided with feature locations ordered in a consistent way, such as from left to right and then from top to bottom in a FOV. The features may be fixed-size rectangular features, with the coordinate arrays having designated entries for respective ones of the centers of the fixed-size rectangular features.

Each coordinate array may have a size of M×N, where M is the number of values required to represent the center of a feature in a given coordinate system and where N is the maximum number of features in the FOV. Various embodiments are described herein with respect to center coordinates represented in a Cartesian coordinate system (e.g., where M is 2 for the X- and Y-axis of layouts). It should be appreciated, however, that various other coordinate systems may be used as desired, possibly with different values of M. An array with fewer than N features may be padded with null values (e.g., 0) that are outside the range of possible coordinates for the FOV. After conversion of the input physical design layout patterns into coordinate arrays, the DL model (e.g., deep CNN model 305-1 may be trained.

The coordinate arrays may be two-dimensional (2D) arrays which represent feature center coordinates in single-layer physical design layout patterns, or three-dimensional (3D) arrays that contain "stacks" of 2D arrays with values representing presence or absence of features in individual layers of an integrated multi-layer.

The deep CNN 305-1 analyzes the input, and outputs predicted labels 307 for the input. In some embodiments, the predicted labels 307 include an output of "1" indicating that the input physical design layout pattern contains a hotspot, and an output of "0" indicating that the input physical design layout pattern is hotspot-free. In other embodiments, the predicted labels 307 may provide finer-grained information, such as information relating to the type of hotspot detected in a particular physical design layout pattern. For example, the output of "0" may indicate that the physical design layout pattern is hotspot-free, the output of "1" may indicate that a first type of hotspot is detected, an output of "2" may indicate that a second type of hotspot is detected, etc.

During inference 350, physical design layout patterns 301-2 are provided as input. While during training 300 the input physical design layout patterns 301-1 may include "known" physical design layout patterns (e.g., known hotspot-containing and hotspot-free physical design layout patterns), the input physical design layout patterns 301-2 used during inference 350 may be "unknown" in that is not known a priori whether such physical design layout patterns contain hotspots. The physical design layout patterns 301-2 are converted to layout images 303-2 or another format suitable for input to the trained deep CNN 305-2. The trained deep CNN 305-2 provides as output hotspot classification information 309 (e.g., an indication of whether a given input physical design layout pattern contains a hotspot) as well as hotspot localization information 311 (e.g., if a hotspot is detected, an indication of where in the given input physical design layout pattern the hotspot is located).

In some embodiments, the hotspot localization information 311 is determined by taking derivatives of model output with respect to a deep convolutional network layer of the deep CNN 305-2. For example, the deep CNN 305-2 may include an input layer and multiple "blocks" or sets of convolutional and pooling layers. For example, first and second blocks may each include two convolutional layers followed by a pooling layer, and third through fifth blocks may each include the convolutional layers followed by a pooling layer. The pooling layers of each block may be max pooling layers. The particular output shape and number of parameters used for each of the different layers of each block may vary as desired.

Figure 4:
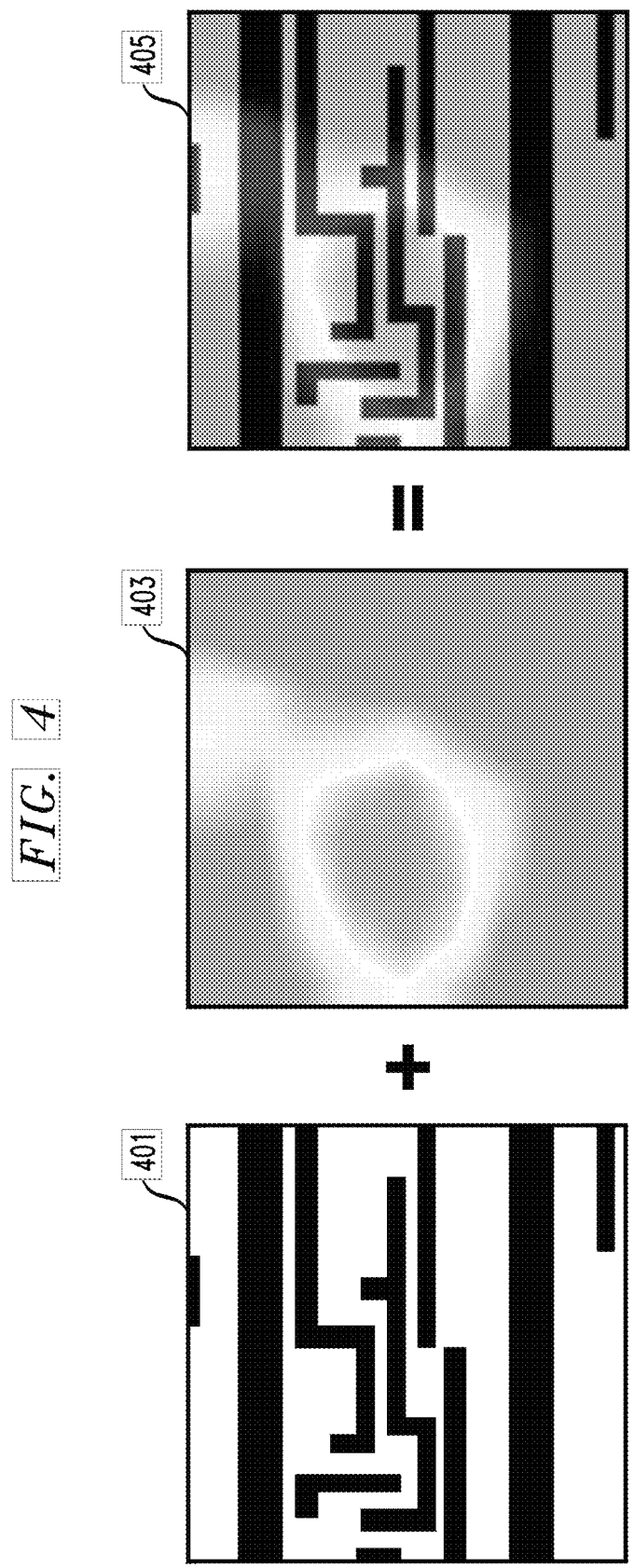
FIG. 4 depicts a physical design layout pattern having a heat pattern overlayed thereon, according to an embodiment of the present invention.

As noted above, in some embodiments the deep CNN 305-2 provides hotspot localization information 311. The hotspot localization information 311 may take the form of a "heat map" localizing the hotspot area of a physical design layout pattern responsive to classifying the physical design layout pattern as containing a hotspot. The heat map can indicate which part(s) of a given physical design layout pattern lead the deep CNN 305-2 to its final classification decision, such as showing with greater intensity the region(s) in which the hotspot(s) occur(s). FIG. 4 shows an example of a physical design layout pattern 401 and its associated heat map 403. The hotspot localization information 311 may include the heat map 403 overlayed on the physical design layout pattern 401 as shown in element 405.

Figure 5:
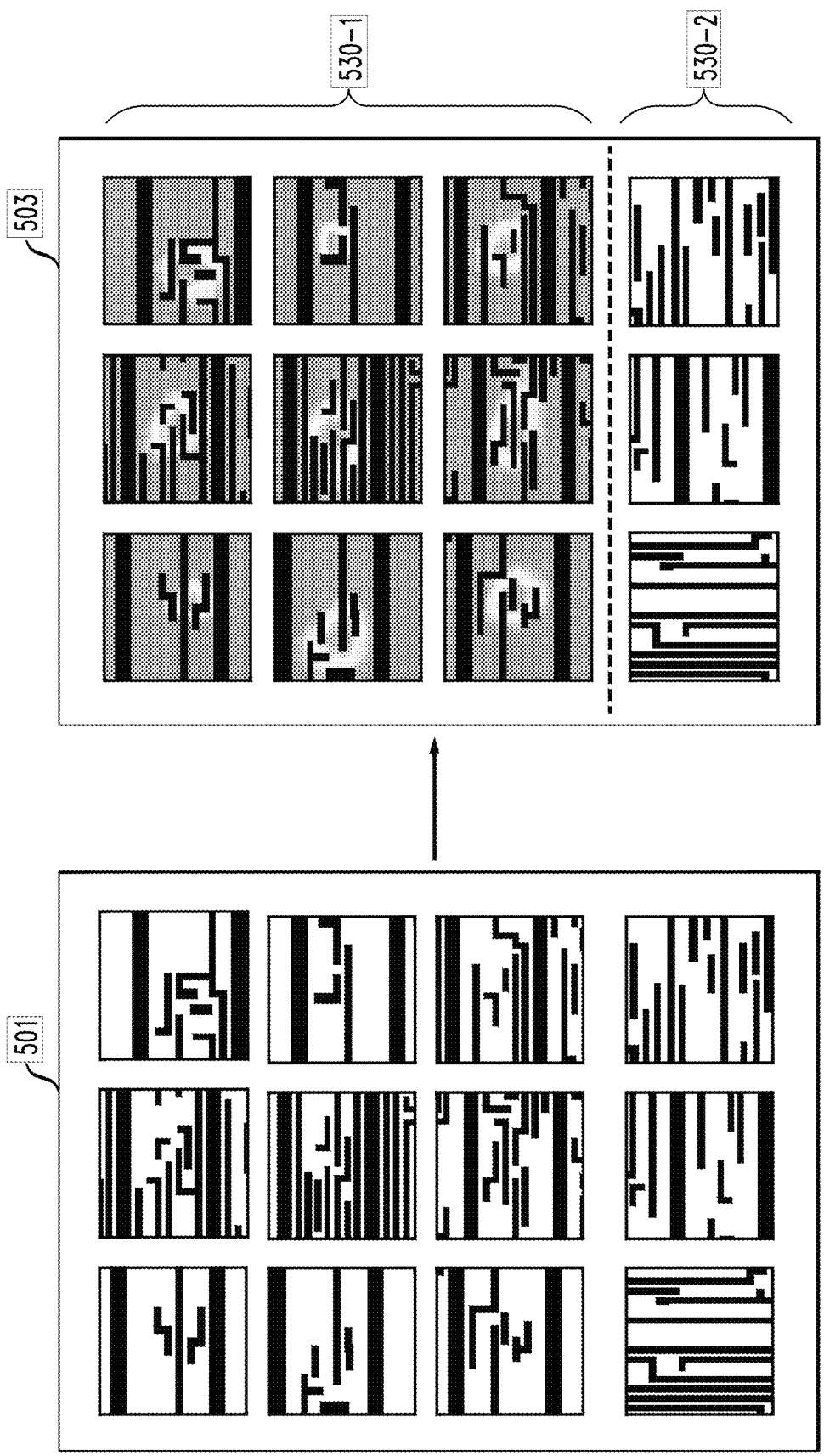
FIG. 5 depicts hotspot detection and localization for a set of physical design layout patterns, according to an embodiment of the present invention.

FIG. 5 shows an example 501 of input physical design layout patterns 301-2 that are classified using the deep CNN 305-2 to provide output 503 including hotspot classification information 309 and hotspot localization information 311. The output 503 shows a first set of physical design layout patterns 530-1 for which hotspots were detected, with each such physical design layout pattern having a heat map overlayed thereon as described above with respect to FIG. 4. The output 503 also includes a second set of physical design layout patterns 530-2 for which hotspots were not detected. As the physical design layout patterns 530-2 are classified as hotspot-free, they do not have heat maps overlayed thereon.

As discussed above, a wide variety of DNN models may be used to implement the hotspot detection model 210. For training a DNN to detect and localize hotspots in physical design layout patterns, the input physical design layout patterns may be represented in various formats, such as in a layout image format, a coordinate array format, etc. Various DNN architectures, including but not limited to CNNs, generative adversarial networks (GANs), recurrent neural networks (RNNs), variational autoencoders (VAEs), combinations thereof, etc. may work with such different formats of input layout patterns (e.g., with coordinate arrays, layout images, etc.).

A physical design layout pattern may include multiple layers, and thus in some embodiments the deep CNN 305-1/305-2 is trained to perform classification across multiple layers at the same time, providing multiple channels for classification and localization to identify hotspots that may result from overlay errors from specific layers of integrated multi-layer layouts.

The hotspot detection model 210 used in some embodiments is an artificial neural network (ANN). An ANN is an information processing system that is inspired by biological nervous systems, such as the brain. The key element of ANNs is the structure of the information processing system, which includes a large number of highly interconnected processing elements (referred to as "neurons") working in parallel to solve specific problems. ANNs are furthermore trained in-use, with learning that involves adjustments to weights that exist between the neurons. An ANN is configured for a specific application, such as pattern recognition or data classification, through such a learning process.

It should be understood that neural networks are flexible constructs that can take many different forms. However, the universal approximation theorem states that a feed-forward network can represent a wide variety of real-valued functions. ANNs may be analog-valued or hardware-based, or may be implemented using a software deep neural network that is implemented on general-purpose processing hardware such as, e.g., a graphics processing unit (GPU).

ANNs demonstrate an ability to derive meaning from complicated or imprecise data and can be used to extract patterns and detect trends that are too complex to be detected by humans or other computer-based systems. The structure of a neural network has input neurons that provide information to one or more "hidden" neurons. Connections between the input neurons and hidden neurons are weighted, and these weighted inputs are then processed by the hidden neurons according to some function in the hidden neurons, with weighted connections between the layers. There may be any number of layers of hidden neurons, and as well as neurons that perform different functions. Various different types of neural network structures may be used as will, including but not limited to CNNs, feed forward neural networks (FFNNs), etc. A set of output neurons accepts and processes weighted input from the last set of hidden neurons. This architecture represents a feedforward computation where information propagates from input neurons to the output neurons. Upon completion of a feed-forward computation, the output is compared to a desired output available from training data. The error relative to the training data is then processed in feedback computation, where the hidden neurons and input neurons receive information regarding the error propagating backward from the output neurons. Once the backward error propagation has been completed, weight updates are performed, with the weighted connections being updated to account for the received error. This represents just one variety of ANN.

As discussed above, the ANN may take the form of a CNN that includes, among the hidden layers, convolutional layers, pooling layers, fully connected (FC) layers, normalization layers, etc. The CNN performs a cross-correlation to identify features of circuit design layouts or more generally patterned structures that correspond to hotspots. The CNN is also able to process multiple channels simultaneously. The characteristics of the CNN may be determined as hyperparameters that include, for example, the number of neural network layers, the type of neural network layers, the number of neurons in each neural network layer, the numbers and sizes of filters, etc. The values for the hyperparameters may be based on factors such as input multi-layer integrated patterns, training accuracy targets, available computing resources, etc.

Figure 6:
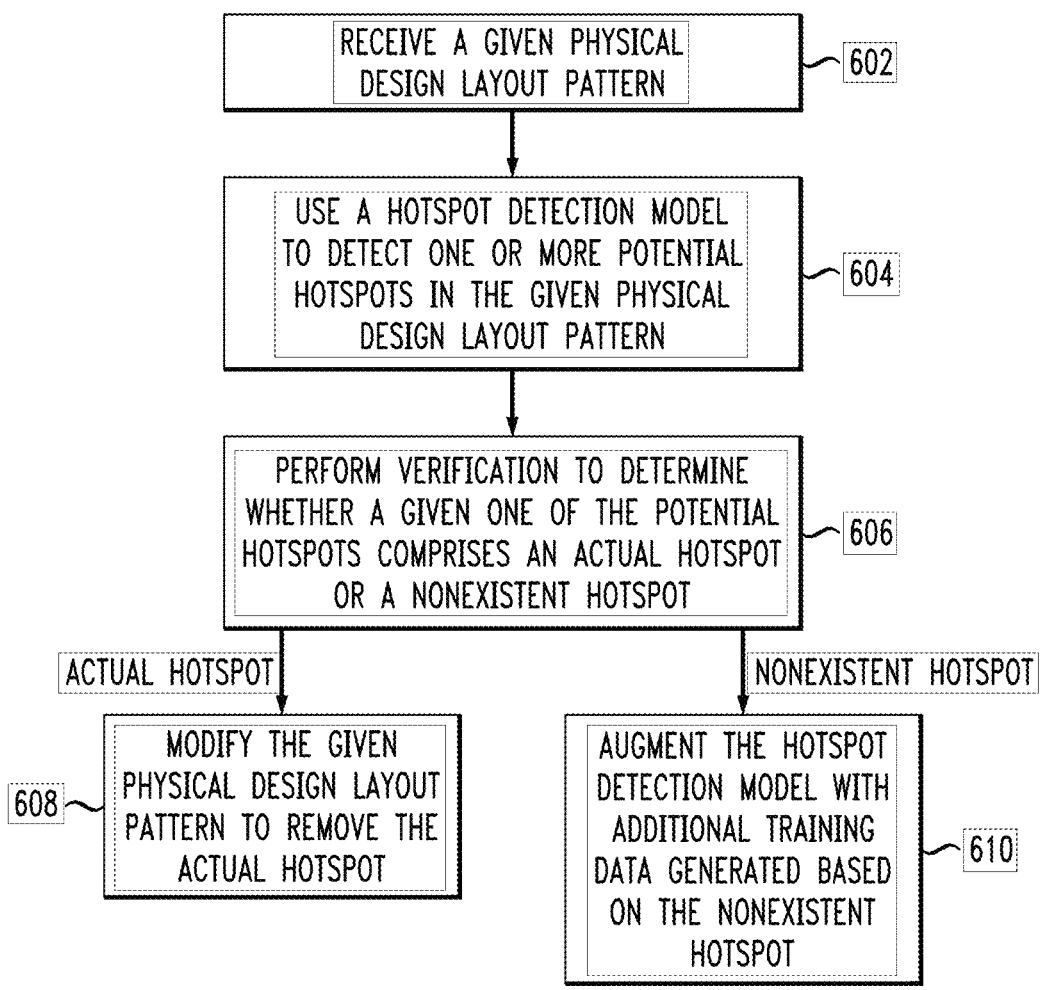
FIG. 6 depicts a workflow for hotspot detection in physical design layout patterns, according to an exemplary embodiment of the present invention.

FIG. 6 depicts a workflow 600 for detecting hotspots in physical design layout patterns. As described above, a hotspot may represent an area of a physical design layout pattern that is not manufacturable, renders at least a portion of a patterned structure comprising the hotspot inoperable, etc. The workflow 600 begins with step 602, receiving a given physical design layout pattern. In step 604, a hotspot detection model is used to detect one or more potential hotspots in the given physical design layout pattern. The hotspot detection model may comprise a machine learning model, such as a CNN or other DL or neural network model.

In step 606, verification is performed to determine whether a given one of the potential hotspots detected by the hotspot detection model comprises a real hotspot or a nonexistent hotspot. In some embodiments, step 606 utilizes OPC simulation of the given physical design layout pattern. In other embodiments, step 606 may utilize wafer verification.

Responsive to determining that the given potential hotspot comprises an actual hotspot in step 606, the workflow 600 continues with step 608, modifying the given physical design layout pattern to remove the actual hotspot. This may involve moving or adjusting the size of features in the given physical design layout pattern that are causing the actual hotspot. Step 604 may include performing hotspot localization for each potential hotspot, such as using a heat map as described above. The heat map may be utilized by a designer in step 608 to narrow the focus and identify where and how to remove the actual hotspot. In some embodiments, step 608 is automated using design rules by altering the locations and/or sizing of features in the region of the given physical design layout pattern corresponding to the actual hotspot as identified using the heat map.

Responsive to determining that the given potential hotspot comprises a nonexistent hotspot in step 606, the workflow 600 continues with step 610, augmenting the hotspot detection model with additional training data generated based on the nonexistent hotspot. In some embodiments, step 610 includes modifying one or more features in the given physical design layout pattern to generate one or more additional training layout patterns, and training the hotspot detection model with the one or more additional training layout patterns.

Modifying the one or more features in the given physical design layout pattern may comprise adjusting a location of at least a given one of the features in the given physical design layout pattern until the given physical design layout pattern comprises an actual hotspot. The additional training layout patterns may include at least a first additional training layout pattern comprising the given physical design layout pattern marked as a hotspot-free physical design layout pattern, and at least a second additional training layout pattern comprising the adjusted physical design layout pattern marked as a hotspot-containing physical design layout pattern. Adjusting the given feature may comprise iteratively adjusting the location of the given feature in designated increments (e.g., 1-2 nm) until the given physical design layout pattern comprises an actual hotspot.

In some embodiments, iteratively adjusting the location of the given feature comprises adjusting the location of the given feature in first and second dimensions of the given physical design layout pattern (e.g., in X and Y dimensions). The additional training layout patterns may thus include a first additional training layout pattern comprising a negative adjustment of the location of the given feature in the first dimension, a second additional training layout pattern comprising a positive adjustment of the location of the given feature in the first dimension, a third additional training layout pattern comprising a negative adjustment of the location of the given feature in the second dimension, and a fourth additional training layout pattern comprising a positive adjustment of the location of the given feature in the second dimension. One of the first and second additional training layout patterns may be marked as hotspot-containing and the other one of the first and second additional training layout patterns may be marked as hotspot-free. Similarly, one of the third and fourth additional training layout patterns may be marked as hotspot-containing and the other one of the third and fourth additional training layout patterns may be marked as hotspot-free.

In some embodiments, modifying the one or more features in the given physical design layout pattern is automated based on a type of hotspot that the hotspot detection model is configured to detect. For example, the hotspot detection model may be configured to detect bridging hotspots, and modifying the one or more features in the given physical design layout pattern may comprise automatically reducing a spacing between a first feature and a second feature in the given physical design layout pattern until a bridging hotspot is detected. As another example, the hotspot detection model may be configured to detect line end shortening hotspots, and modifying the one or more features in the given physical design layout may comprise narrowing a line end width of a given feature until a line end width hotspot is detected.

The workflow 600 may further include evaluating manufacturability of a given patterned structure comprising the given physical design layout pattern. Evaluating manufacturability may include performing a manufacturability study by at least one of process simulation and wafer verification of the given physical design layout pattern, or performing some other type of failure mode analysis once the hotspot detection model no longer detects any potential hotspots in the given physical design layout pattern (e.g., following repeat of steps 604-610 until no potential hotspots are detected for the given physical design layout pattern).

Embodiments of the present invention include a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Python, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
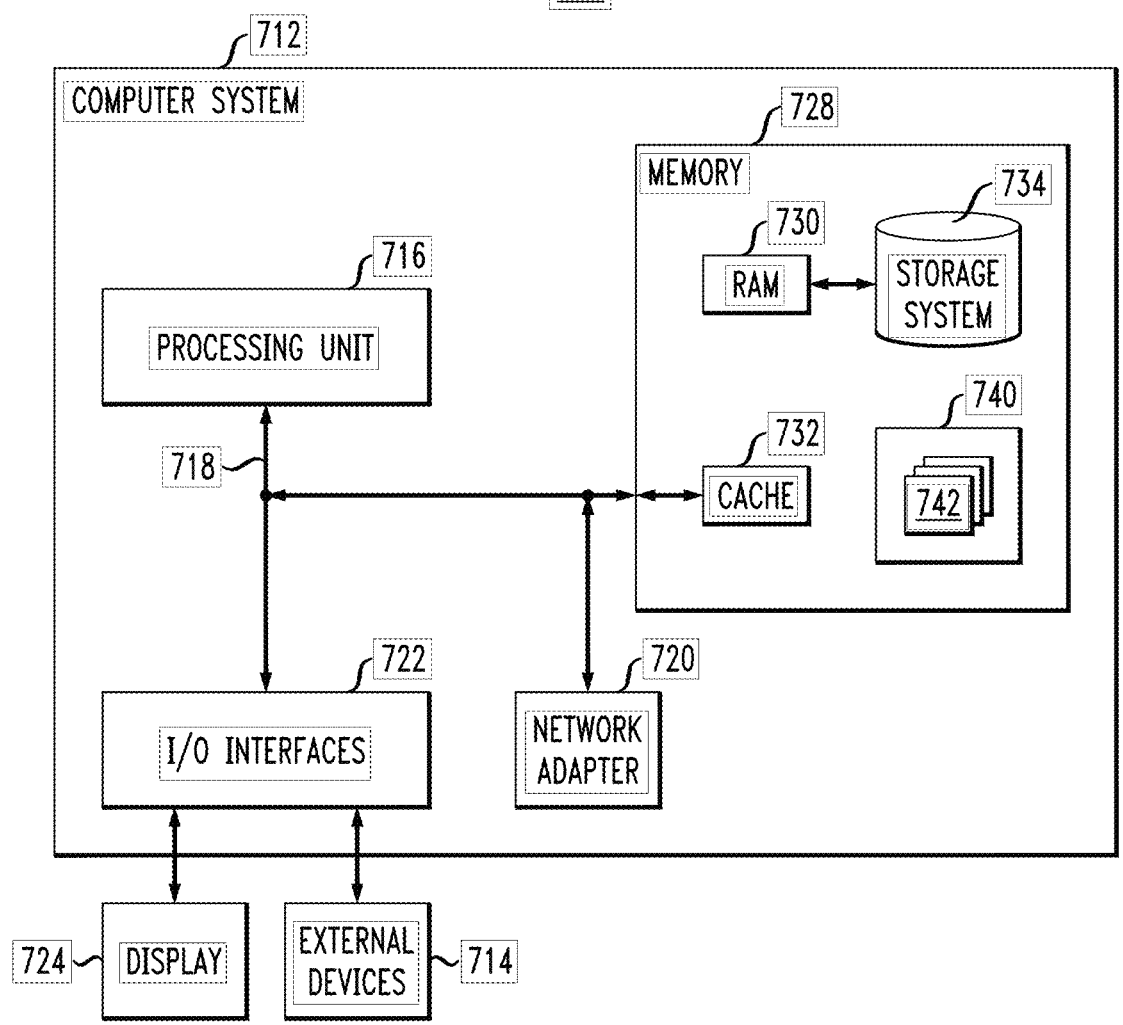
FIG. 7 depicts a computer system in accordance with which one or more components/steps of techniques of the invention may be implemented, according to an exemplary embodiment of the invention.

One or more embodiments can make use of software running on a general-purpose computer or workstation. With reference to FIG. 7, in a computing node 710 there is a computer system/server 712, which is operational with numerous other general purpose or special purpose computing system environments or configurations. Examples of well-known computing systems, environments, and/or configurations that may be suitable for use with computer system/server 712 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, mobile and wearable devices, and distributed cloud computing environments that include any of the above systems or devices, and the like.

Computer system/server 712 may be described in the general context of computer system executable instructions, such as program modules, being executed by a computer system. Generally, program modules may include routines, programs, objects, components, logic, data structures, and so on that perform particular tasks or implement particular abstract data types. Computer system/server 712 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 7, computer system/server 712 in computing node 710 is shown in the form of a general-purpose computing device. The components of computer system/server 712 may include, but are not limited to, one or more processors or processing units 716, a system memory 728, and a bus 718 that couples various system components including system memory 728 to processor 716.

The bus 718 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 712 typically includes a variety of computer system readable media. Such media may be any available media that is accessible by computer system/server 712, and it includes both volatile and non-volatile media, removable and non-removable media.

The system memory 728 can include computer system readable media in the form of volatile memory, such as random access memory (RAM) 730 and/or cache memory 732. The computer system/server 712 may further include other removable/non-removable, volatile/nonvolatile computer system storage media. By way of example only, storage system 734 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 718 by one or more data media interfaces. As depicted and described herein, the memory 728 may include at least one program product having a set (e.g., at least one) of program modules that are configured to carry out the functions of embodiments of the invention. A program/utility 740, having a set (at least one) of program modules 742, may be stored in memory 728 by way of example, and not limitation, as well as an operating system, one or more application programs, other program modules, and program data. Each of the operating system, one or more application programs, other program modules, and program data or some combination thereof, may include an implementation of a networking environment. Program modules 742 generally carry out the functions and/or methodologies of embodiments of the invention as described herein.

Computer system/server 712 may also communicate with one or more external devices 714 such as a keyboard, a pointing device, a display 724, etc., one or more devices that enable a user to interact with computer system/server 712, and/or any devices (e.g., network card, modem, etc.) that enable computer system/server 712 to communicate with one or more other computing devices. Such communication can occur via I/O interfaces 722. Still yet, computer system/server 712 can communicate with one or more networks such as a LAN, a general WAN, and/or a public network (e.g., the Internet) via network adapter 720. As depicted, network adapter 720 communicates with the other components of computer system/server 712 via bus 718. It should be understood that although not shown, other hardware and/or software components could be used in conjunction with computer system/server 712. Examples include, but are not limited to, microcode, device drivers, redundant processing units, external disk drive arrays, RAID systems, tape drives, and data archival storage systems, etc.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 8:
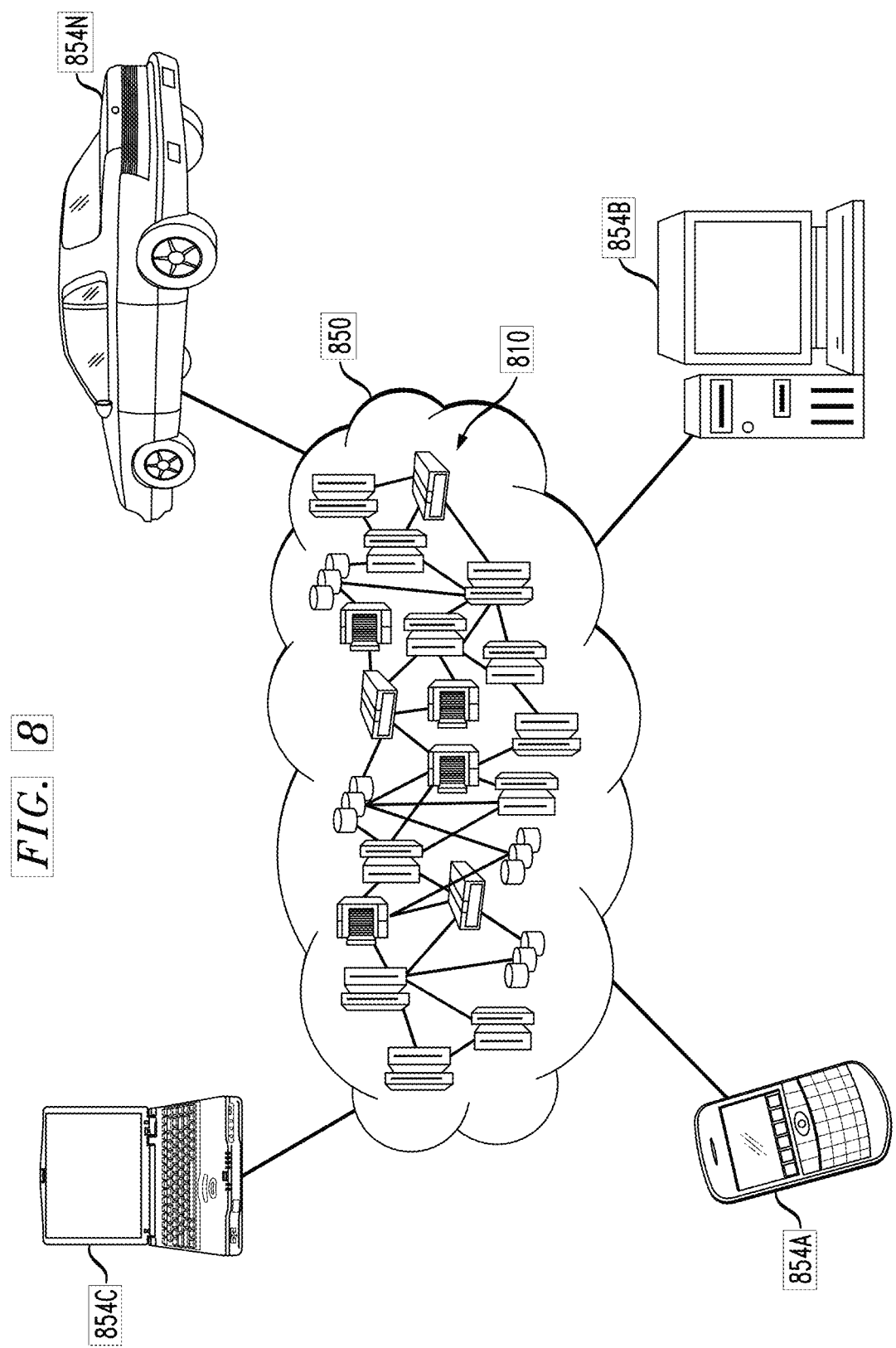
FIG. 8 depicts a cloud computing environment, according to an exemplary embodiment of the present invention.

Referring now to FIG. 8, illustrative cloud computing environment 850 is depicted. As shown, cloud computing environment 850 includes one or more cloud computing nodes 810 with which local computing devices used by cloud consumers, such as, for example, personal digital assistant (PDA) or cellular telephone 854A, desktop computer 854B, laptop computer 854C, and/or automobile computer system 854N may communicate. Nodes 810 may communicate with one another. They may be grouped (not shown) physically or virtually, in one or more networks, such as Private, Community, Public, or Hybrid clouds as described hereinabove, or a combination thereof. This allows cloud computing environment 850 to offer infrastructure, platforms and/or software as services for which a cloud consumer does not need to maintain resources on a local computing device. It is understood that the types of computing devices 854A-N shown in FIG. 8 are intended to be illustrative only and that computing nodes 810 and cloud computing environment 850 can communicate with any type of computerized device over any type of network and/or network addressable connection (e.g., using a web browser).

Figure 9:
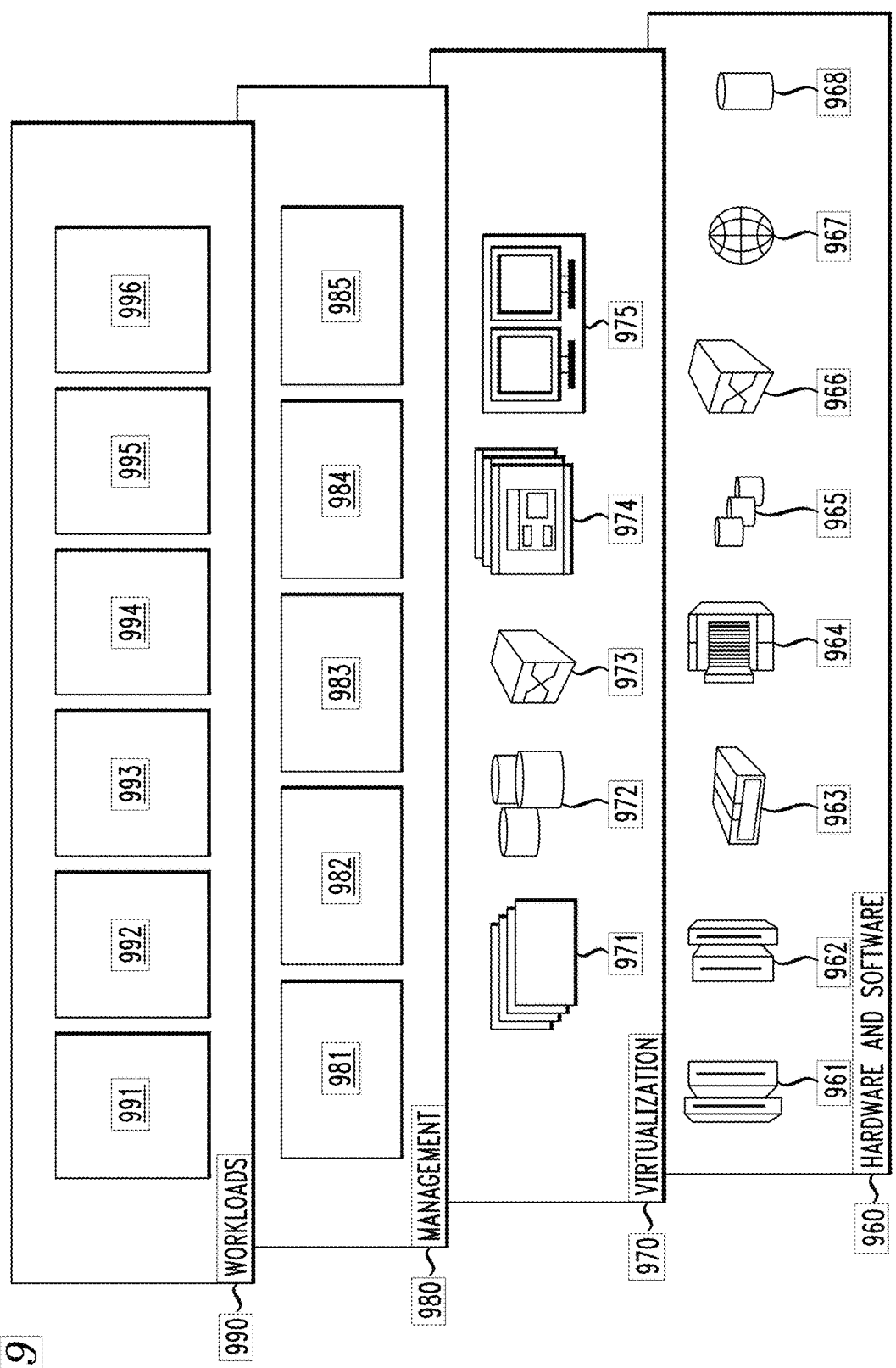
FIG. 9 depicts abstraction model layers, according to an exemplary embodiment of the present invention.

Referring now to FIG. 9, a set of functional abstraction layers provided by cloud computing environment 850 (FIG. 8) is shown. It should be understood in advance that the components, layers, and functions shown in FIG. 9 are intended to be illustrative only and embodiments of the invention are not limited thereto. As depicted, the following layers and corresponding functions are provided:

Hardware and software layer 960 includes hardware and software components. Examples of hardware components include: mainframes 961; RISC (Reduced Instruction Set Computer) architecture based servers 962; servers 963; blade servers 964; storage devices 965; and networks and networking components 966. In some embodiments, software components include network application server software 967 and database software 968.

Virtualization layer 970 provides an abstraction layer from which the following examples of virtual entities may be provided: virtual servers 971; virtual storage 972; virtual networks 973, including virtual private networks; virtual applications and operating systems 974; and virtual clients 975.

In one example, management layer 980 may provide the functions described below. Resource provisioning 981 provides dynamic procurement of computing resources and other resources that are utilized to perform tasks within the cloud computing environment. Metering and Pricing 982 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 983 provides access to the cloud computing environment for consumers and system administrators. Service level management 984 provides cloud computing resource allocation and management such that required service levels are met. Service Level Agreement (SLA) planning and fulfillment 985 provide pre-arrangement for, and procurement of, cloud computing resources for which a future requirement is anticipated in accordance with an SLA.

Workloads layer 990 provides examples of functionality for which the cloud computing environment may be utilized. Examples of workloads and functions which may be provided from this layer include: mapping and navigation 991; software development and lifecycle management 992; virtual classroom education delivery 993; data analytics processing 994; transaction processing 995; and hotspot detection processing 996, which may perform various functions for detecting hotspots in physical design layout patterns using the techniques described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for detecting hotspots in physical design layout patterns, the method comprising steps of:
   receiving a given physical design layout pattern;
   utilizing a hotspot detection model to detect one or more potential hotspots in the given physical design layout pattern;
   performing a verification to determine whether a given potential hotspot of the one or more potential hotspots detected by the hotspot detection model comprises a real hotspot or a nonexistent hotspot;
   responsive to determining that the given potential hotspot comprises an actual hotspot, modifying the given physical design layout pattern to remove the actual hotspot; and
   responsive to determining that the given potential hotspot comprises a nonexistent hotspot, augmenting the hotspot detection model with additional training data generated based on the nonexistent hotspot;
   wherein augmenting the hotspot detection model with additional training data generated based on the nonexistent hotspot comprises:
      modifying one or more features in the given physical design layout pattern to generate one or more additional training layout patterns; and
      training the hotspot detection model with the one or more additional training layout patterns; and
   wherein the method is performed by at least one processing device comprising a processor coupled to a memory.

2. The method of claim 1, wherein a hotspot represents an area of a physical design layout pattern that at least one of: is not manufacturable; and renders at least a portion of a patterned structure comprising the hotspot inoperable.

3. The method of claim 2, wherein the hotspot detection model comprises a machine learning model.

4. The method of claim 3, wherein the machine learning model comprises a convolutional neural network (CNN) model.

5. The method of claim 1, wherein the performing a verification comprises performing optical proximity correction (OPC) simulation of the given physical design layout pattern.

6. The method of claim 1, wherein the performing a verification comprises performing a wafer verification of the given physical design layout pattern.

7. The method of claim 1, wherein the modifying the one or more features in the given physical design layout pattern comprises adjusting a location of at least one given feature of the one or more features in the given physical design layout pattern until the given physical design layout pattern comprises an actual hotspot.

8. The method of claim 7, further comprising:
   generating at least a first additional training layout pattern comprising the given physical design layout pattern marked as a hotspot-free physical design layout pattern; and
   generating at least a second additional training layout pattern comprising the adjusted given physical design layout pattern marked as a hotspot-containing physical design layout pattern.

9. The method of claim 7, wherein adjusting the given feature comprises iteratively adjusting the location of the given feature in designated increments until the given physical design layout pattern comprises an actual hotspot.

10. The method of claim 9, wherein the iteratively adjusting the location of the given feature comprises adjusting the location of the given feature in a first dimension and a second dimension of the given physical design layout pattern.

11. The method of claim 10, further comprising:
   generating at least a first additional training layout pattern comprising a negative adjustment of the location of the given feature in the first dimension;
   generating at least a second additional training layout pattern comprising a positive adjustment of the location of the given feature in the first dimension;
   generating at least a third additional training layout pattern comprising a negative adjustment of the location of the given feature in the second dimension; and generating at least a fourth additional training layout pattern comprising a positive adjustment of the location of the given feature in the second dimension.

12. The method of claim 11, wherein one of the first additional training layout pattern and the second additional training layout pattern is marked as hotspot-containing and the other one of the first additional training layout pattern and the second additional training layout pattern is marked as hotspot-free, and wherein one of the third additional training layout pattern and the fourth additional training layout pattern is marked as hotspot-containing and the other one of the third additional training layout pattern and the fourth additional training layout pattern is marked as hotspot-free.

13. The method of claim 7, wherein the modifying the one or more features in the given physical design layout pattern is automated based on a type of hotspot that the hotspot detection model is configured to detect.

14. The method of claim 13, wherein the hotspot detection model is configured to detect bridging hotspots, and wherein the modifying the one or more features in the given physical design layout pattern comprises automatically reducing a spacing between a first feature and a second feature in the given physical design layout pattern until a bridging hotspot is detected.

15. The method of claim 13, wherein the hotspot detection model is configured to detect line end shortening hotspots, and wherein the modifying the one or more features in the given physical design layout comprises narrowing a line end width of a given feature until a line end width hotspot is detected.

16. The method of claim 1, further comprising evaluating manufacturability of a given patterned structure comprising the given physical design layout pattern.

17. The method of claim 1, further comprising repeating the modifying and the augmenting until no potential hotspots are detected for the given physical design layout pattern.

18. A computer program product, the computer program product comprising a non-transitory computer readable storage medium having program instructions embodied therewith, the program instructions executable by at least one computing device to cause the at least one computing device to perform steps of:
receiving a given physical design layout pattern;
utilizing a hotspot detection model to detect one or more potential hotspots in the given physical design layout pattern;
performing a verification to determine whether a given potential hotspot of the one or more potential hotspots detected by the hotspot detection model comprises a real hotspot or a nonexistent hotspot;
responsive to determining that the given potential hotspot comprises an actual hotspot, modifying the given physical design layout pattern to remove the actual hotspot; and
responsive to determining that the given potential hotspot comprises a nonexistent hotspot, augmenting the hotspot detection model with additional training data generated based on the nonexistent hotspot;
wherein augmenting the hotspot detection model with additional training data generated based on the nonexistent hotspot comprises:
modifying one or more features in the given physical design layout pattern to generate one or more additional training layout patterns; and
training the hotspot detection model with the one or more additional training layout patterns.

19. An apparatus comprising:
a memory; and
at least one processor coupled to the memory and configured for:
receiving a given physical design layout pattern;
utilizing a hotspot detection model to detect one or more potential hotspots in the given physical design layout pattern;
performing a verification to determine whether a given potential hotspot of the one or more potential hotspots detected by the hotspot detection model comprises a real hotspot or a nonexistent hotspot;
responsive to determining that the given potential hotspot comprises an actual hotspot, modifying the given physical design layout pattern to remove the actual hotspot; and
responsive to determining that the given potential hotspot comprises a nonexistent hotspot, augmenting the hotspot detection model with additional training data generated based on the nonexistent hotspot;
wherein augmenting the hotspot detection model with additional training data generated based on the nonexistent hotspot comprises:
modifying one or more features in the given physical design layout pattern to generate one or more additional training layout patterns; and
training the hotspot detection model with the one or more additional training layout patterns.

20. The apparatus of claim 19, wherein the modifying the one or more features in the given physical design layout pattern comprises adjusting a location of at least one given feature of the one or more features in the given physical design layout pattern until the given physical design layout pattern comprises an actual hotspot.

* * * * *